(12) United States Patent
Obradovic et al.

(10) Patent No.: US 7,682,892 B2
(45) Date of Patent: Mar. 23, 2010

(54) MOS DEVICE AND PROCESS HAVING LOW RESISTANCE SILICIDE INTERFACE USING ADDITIONAL SOURCE/DRAIN IMPLANT

(75) Inventors: Borna Obradovic, McKinney, TX (US);
Shashank Ekbote, Allen, TX (US);
Mark Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 194 days.

(21) Appl. No.: 11/848,962

(22) Filed: Aug. 31, 2007

(65) Prior Publication Data

US 2009/0057759 A1 Mar. 5, 2009

(51) Int. Cl.
*H01L 21/8238* (2006.01)
(52) U.S. Cl. ............................ 438/199; 257/E21.632; 257/E29.345
(58) Field of Classification Search ................. 257/338, 257/E21.632, E29.345; 438/199
See application file for complete search history.

(56) References Cited

U.S. PATENT DOCUMENTS

| 2002/0146904 | A1* | 10/2002 | Buynoski et al. | 438/682 |
| 2005/0208764 | A1* | 9/2005 | Lu et al. | 438/655 |
| 2007/0298558 | A1* | 12/2007 | Yamauchi et al. | 438/197 |
| 2007/0298575 | A1* | 12/2007 | Nouri et al. | 438/308 |

* cited by examiner

*Primary Examiner*—Trung Dang
(74) *Attorney, Agent, or Firm*—Jacqueline J. Garner; Wade J. Brady, III; Frederick J. Telecky, Jr.

(57) ABSTRACT

An integrated circuit (IC) includes a semiconductor substrate, a least one MOS transistor formed in or on the substrate, the MOS transistor including a source and drain doped with a first dopant type having a channel region of a second dopant type interposed between, and a gate electrode and a gate insulator over the channel region. A silicide layer forming a low resistance contact is at an interface region at a surface portion of the source and drain. At the interface region a chemical concentration of the first dopant is at least $5 \times 10^{20}$ cm$^{-3}$. Silicide interfaces according to the invention provide MOS transistor with a low silicide interface resistance, low pipe density, with an acceptably small impact on short channel behavior.

13 Claims, 4 Drawing Sheets

MOS DEVICE AND PROCESS HAVING LOW RESISTANCE SILICIDE INTERFACE USING ADDITIONAL SOURCE/DRAIN IMPLANT

FIELD OF THE INVENTION

The present invention relates to complementary metal oxide semiconductor (CMOS) device manufacturing and resulting CMOS devices, and in particular to a method of fabricating a shallow junction CMOS device in which the silicide interface resistance is low, while still limiting both yield reducing pipes and the short channel effect (SCE).

BACKGROUND

Advances in the miniaturization of complementary-metal-oxide-semiconductor (CMOS) devices have been a key driving force behind the explosive growth of various network centric computing products such as ASIC high-speed microprocessors and memories, low power hand-held computing devices and advanced multi-media audio and video devices. Smaller CMOS devices typically equate to faster switching times which in turn lead to faster and better performing end user systems.

It is well known that as the contact area decreases, contact resistance increases, and as the active semiconductor dopant level at the contact surface increases, contact resistance between a metal or other contact layer and the semiconductor decrease. Since resistance at the Schottky (metal/semiconductor) interface of the source/drain electrode is generally the largest component of total electrode resistance in MOS devices, it is expected to have the largest impact on device speed.

Traditional MOS transistors often use metal silicide layers. Before silicide processing, the source/drain (S/D) implants are performed then annealed at a high temperature (e.g. >950 C) to achieve a high percentage of active dopant relative to the chemical dopant provided, such as at least 30% for both the n+ and p+ regions. A self-aligned silicidation process (salicide) is often used to form the region of titanium, cobalt or tungsten silicide on the gate electrode and source/drain regions of the MOS transistor. In this process, the area to be silicided is generally rendered amorphous in a pre-amorphization (PA) step prior to silicidation to help prevent the formation of micro-defects commonly referred to as pipes which can result in shorts or increased leakage between spaced apart impurity regions of semiconductor devices that need to be electrically isolated from one another for proper device operation. However, the PA process is known to deactivate essentially all of the source and drain dopant in the surface through a depth of at least about 300 A.

One previous solution to the silicide interface resistance problem involves use of a higher reaction temperature capable silicide to provide a higher active dopant concentration. For example, Ni—Pt silicides, instead of Ni, allows increasing the reaction temperature to about 475-500 C However, while a modest improvement generally results, the improvement is not sufficient to overcome the reduction in doping concentration at state of the art processes, such as at the 45 nm node.

Due to silicide integrity concerns for silicides, including Ni or NiPt silicides, the maximum temperature generally allowed after metal interface layer deposition (e.g. NiPt) is generally less than 500 C, such as about 475 C Temperatures over about 500 C are known to lead to yield issues mainly due to silicide agglomeration. Agglomeration is present whether the silicide is NiPt or not (NiPt generally being the silicide having the highest known temperature tolerance). While the agglomeration related failures generally do not result in hard failures (i.e. some devices will work), the fraction of failed devices increases substantially as the temperature is increased and the junction depth is decreased, reducing the yield to an unacceptable level for many processes.

As a result of the temperature limitation to less than about 475 C, the silicide anneal upon which recrystallization takes place only partially reactivates the dopant within about 300 A of the surface, such as to a level of about 10%. For a conventional process where the surface dopant surface concentration is about $10^{20}$ $cm^{-3}$, the active surface concentration (which as noted above determines the interface resistance) becomes only about $1 \times 10^{19}$ $cm^{-3}$. Accordingly, there is a tradeoff in current processing between high circuit yield resulting from the minimization of pipes and other defects and low silicide interface resistance and accompanying improved transistor speed. Moreover, too high a doping concentration is known to result in an increase in SCE. What is needed is a process and resulting MOS device design that provides both high yield (minimization of pipes and other crystal defects), low silicide interface resistance allowing higher drive current, faster MOS transistor performance, and good short channel behavior.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An integrated circuit (IC) includes a semiconductor substrate, a least one MOS transistor formed in or on the substrate, the MOS transistor including a source and drain doped with a first dopant type having a channel region of a second dopant type interposed between, and a gate electrode and a gate insulator over the channel region. A silicide layer forming a low resistance contact is at an interface region at a surface portion of the source and drain. At the interface region a chemical concentration of the first dopant is at least $5 \times 10^{20}$ $cm^{-3}$. Silicide interfaces according to the invention generally provide MOS transistor with low silicide interface resistance, low pipe density, with an acceptably small impact on short channel behavior.

For NMOS, the first dopant type can be n-type, such as As or P. For PMOS, the first dopant type can be p-type, such as boron. In one embodiment, the chemical concentration of the first dopant is $>1 \times 10^{21}$ $cm^{-3}$.

Both the PMOS and NMOS can benefit from the present invention. In one embodiment, the IC comprises a CMOS IC, wherein for both the NMOS and PMOS devices, at their respective interface regions, the chemical concentration of respective dopants is at least $5 \times 10^{20}$ $cm^{-3}$.

A method of forming a MOS transistor comprises the steps of providing a semiconductor substrate, forming a gate electrode over a gate insulator, forming a source and drain by implanting a first S/D implant of a first dopant type, the source and drain being separated by a channel region of a second dopant type having the gate electrode and the gate insulator thereon. A second S/D implant of the first dopant is implanted into a surface portion of the source and drain. Annealing the first and second S/D implants follows. A silicide layer is formed at an interface region at a surface portion of the source and drain by depositing a metal comprising interface layer at the interface region and performing a silicide anneal, the silicide anneal also partially activating the first dopant provided by the first and second S/D implant, wherein at the interface region a total chemical dopant concentration of the first dopant is at least $5\times10^{20}$ cm$^{-3}$. The silicide anneal is generally performed at a temperature $\leqq 500$ C The second S/D implant is a shallow implant, with a projected range generally being between 150 A and 400 A, such as 150 to 250 A. In one embodiment, the implanting step comprises a dose for the second S/D implant of between $5\times10^{14}$ cm$^{-2}$ and $4.0\times10^{15}$ cm$^{-2}$. In one embodiment of the invention the implanting step comprises implanting As, at an energy of 1.0 to 3.0 KeV and a dose between $5\times10^{14}$ cm$^{-2}$ and $2.0\times10^{15}$ cm$^{-2}$, such as between 1.5 to 2.5 KeV. In another embodiment, the implanting step comprises implanting P, at dose between $5.0\times10^{14}$ cm$^{-2}$ and $2.0\times10^{15}$ cm$^{-2}$ and at an energy provide a projected range of between 150 A and 400 A in the surface portion. In yet another embodiment, the implanting step comprises implanting B at dose between $8.0\times10^{14}$ cm$^{-2}$ and $3.0\times10^{15}$ cm$^{-2}$ and at an energy provide a projected range of between 150 A and 400 A in the surface portion. The method can also include the step of pre-amorphization before the second S/D implant using a non-dopant species, such as Si, Ge or C. In another embodiment, the IC formed comprises a CMOS IC, wherein for both the NMOS and PMOS devices, at their respective interface regions, the chemical concentration of respective dopants is at least $5\times10^{20}$ cm$^{-3}$.

The forming of the silicide layer can comprise the step of pre-amorphization. In one embodiment, the first and second S/D implant are performed using the same mask level. In an alternate embodiment, the first and second implants are performed using different masking levels.

In one specific embodiment of the present invention, a method of forming a NMOS transistor comprises the steps of providing a semiconductor substrate, forming a gate electrode over a gate insulator, forming a source and drain by implanting a first n+ S/D implant, the source and drain separated by a p-type channel region having the gate electrode and the gate insulator thereon. A second n+ S/D is implanted into a surface portion of the source and drain, wherein the second n+ S/D implant comprises an As dose of $5\times10^{14}$ to $2.2\times10^{15}$ cm$^{-2}$ at an energy of 1.5 to 2.5 KeV. The first and second n+ S/D implants are annealed. The interface region at a surface portion of the source and the drain are pre-amorphized, such as using a Si, Ge or C implant. A metal comprising interface layer is deposited at the interface region. A silicide anneal is performed at a temperature of <500 C to form a silicide and to partially activate dopant provided by the first and second n+ S/D implants, wherein at the interface region a total chemical dopant concentration of n-type dopant is at least $5\times10^{20}$ cm$^{-3}$.

DETAILED DESCRIPTION

Figure 1:
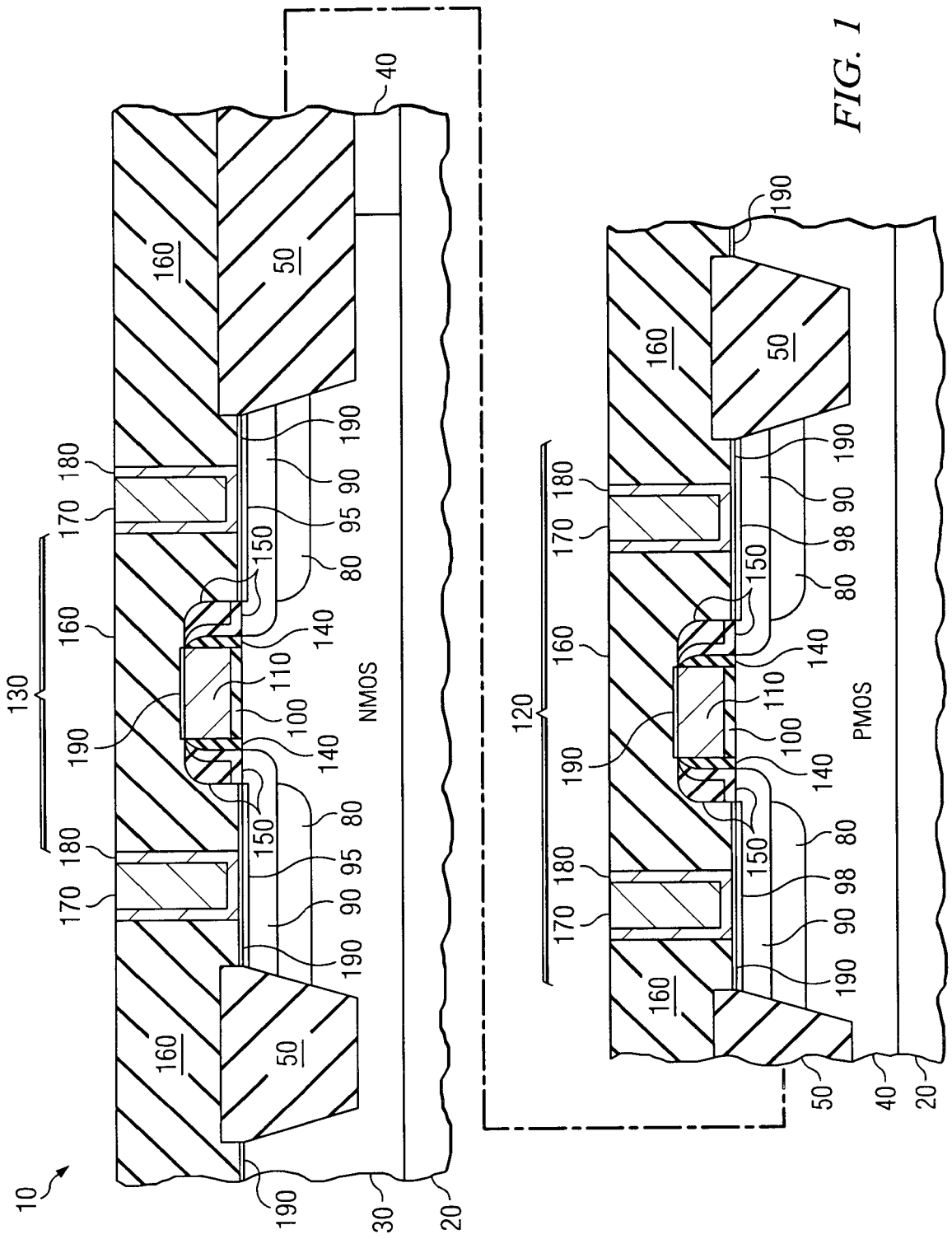
FIG. 1 is a cross-sectional view of a partially fabricated semiconductor wafer having a silicide interface in accordance with an embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present invention provides a new implant-related method of forming low resistance silicide/heavily doped silicon contacts which minimizes the interface resistance of silicided contacts (silicide interface resistance), and also minimizes the formation of yield-reducing pipes and other crystalline defects in the areas (e.g. junctions) proximate to such contacts. Applied to MOS transistors, the present invention limits MOS device degradation associated with the SCE.

The present invention will generally be described as applied to MOS transistors. However, the present invention can also benefit a wide variety of non-MOS devices. Since interface resistance is almost always an undesirable parasitic, reducing it is beneficial to just about every device that includes them. Accordingly, the present invention can benefit essentially any device that requires a low resistance (Ohmic) Schottky interface comprising a silicide/heavily doped semiconductor surface. Examples of active devices other than MOS that are currently in common use that can benefit from the present invention include, but are not limited to, JFETs, and bipolar devices including SiGe HBTs. As known in the art, SiGe HBT is similar to a conventional Si bipolar transistor except for the base, where SiGe, a material with narrower bandgap than Si, is used as the base material. Passive devices can also benefit from the present invention, such as diffused precision resistors or inductors. Regarding many passive devices, an important aspect is the precision by which the resistance is set. For passive devices having silicide contacts in which precise resistance is required, the present invention can be used to overcome the known difficulty associated with conventional processing which results in poor and inconsistent dopant level activation at the semiconductor surface contact with the silicide. Being on the steep part of the interface resistance vs. doping curve, small variations in active doping concentration leads to a large change in the resistivity. Thus, the present invention may be implemented in processes other than MOS processes and structures other than MOS transistor structures, such as passives including inductors and capacitors, and actives including diodes, JFETs and bipolar devices, and in processes including biCMOS and bipolar.

Applied to MOS, the method comprises the conventional steps of providing a semiconductor substrate, forming a gate electrode over a gate insulator, implanting a source and drain (and generally a source/drain extension) of a first dopant type, but adds an ultra-shallow second (additional) heavy dose S/D implant of the first dopant type into a surface portion of the source and drain prior to silicide formation. As noted above, the second S/D implant is referred to herein as an XSD implant, p+ XSD implant in the case of PMOS and n+ XSD implant in the case of NMOS. As defined below, the XSD implant(s) are at a very low energy and a high dose. The XSD implant results in a narrow spike of dopant at the surface, when combined the conventional S/D dopant at the surface, despite a generally low % active dopant concentration, provides an active dopant concentration at the silicide surface in the final device that is well above activation limits obtainable using conventional processing.

As defined herein, the ultra-shallow depth of the XSD implant refers to an as-implanted peak being $\leq 500$ A of the silicon surface, generally being 200 to 300 A from the Si surface, while p+ or n+ refers to an implanted dose of at least $5 \times 10^{14}$ cm$^{-2}$. In one embodiment of the invention, following the partial activation provided by the relatively low temperature (<500 C) silicide anneal, the dopant primarily from the XSD implant which is proximate to the surface is partially activated by the silicide anneal, wherein a resulting total chemical dopant concentration is at least $5 \times 10^{20}$ cm$^{-3}$. A ratio of active/chemical dopant concentration at the interface is generally $\leq 15\%$.

The present invention is thus distinct as compared to known processes. Conventional process flows optimize the S/D implants to maximize active concentration after the high temperature anneal, such as a >1000 C RTA spike anneal, not after silicide growth. Thus, shallow implants which set the chemical concentration far above the active concentration, such as generally provided by XSD implants according to the present invention, are not used in conventional MOS processes.

Referring now to the drawings, FIG. 1 is a cross-sectional view of a partially fabricated semiconductor wafer 10 having a silicide interface in accordance with the present invention. In the example application, CMOS transistors 120, 130 are formed within a semiconductor substrate 20 having an NMOS region 30 and a PMOS region 40. However, it is within the scope of the invention to use a semiconductor wafer 10 that contains any one of a variety of semiconductor devices, such as bipolar junction transistors, capacitors, or diodes.

The example CMOS transistors 120, 130 are electrically insulated from other active devices (not shown) by shallow trench isolation structures 50 formed within the NMOS and PMOS regions 30, 40; however, any conventional isolation structure may be used such as field oxide regions (also known as "LOCOS" regions) or implanted isolation regions. The semiconductor wafer 10 is a single-crystalline substrate that is doped to be n-type and p-type; however, it may be formed by fabricating an epitaxial silicon layer on a single-crystal substrate.

In general, transistors are comprised of a gate, source, and drain. More specifically, as shown in FIG. 1, the active portion of the transistors 120, 130 contain source/drain regions 80, 90 comprised of deep sources/drains 80 and source/drain extensions 90. In addition, the active portion of the transistors 120, 130 contains a gate that is comprised of a gate dielectric (e.g. an oxide) 100 and a doped gate polysilicon electrode 110.

The example PMOS transistor 120 is a p-channel MOS transistor. Therefore it is formed within a n-well region 40 of the semiconductor wafer 10. In addition, the deep sources and drains 80 and the source and drain extensions 90 have p-type dopants. The p+ dopant surface region including dopant from the p-type XSD implant according to the present invention is shown as 98. Illustrative examples of p-type dopants include, but are not limited to: B or In. The source and drain extensions 90 may be lightly doped ("LDD"), medium doped ("MDD"), or highly doped ("HDD"). The PMOS transistor gate is generally created from p-type doped polysilicon 110 and a gate dielectric 100.

Similarly, the example NMOS transistor 130 is an n-channel MOS transistor. Therefore it is formed within a p-well region 30 of the semiconductor wafer 10. In addition, the deep sources and drains 80 and the source and drain extensions 90 have n-type dopants. Similar to PMOS transistor 120, the source and drain extensions 90 of NMOS transistor 130 may be lightly doped ("LDD"), medium doped ("MDD"), or highly doped ("HDD"). The n+ dopant surface region including dopant from the XSD implant according to the present invention is shown as 95. Illustrative examples of n-type dopants that can be employed in the present invention include, but are not limited to: As, P, or Sb. The NMOS transistor gate is created from n-type doped polysilicon 110 and a gate dielectric 100.

A sidewall spacer structure comprising offset layers 140, 150 can be used during fabrication to enable the proper placement of the source/drain extensions 90 and the silicide 190 (described more fully below). The source/drain extension regions 90 are formed using the gate stack 100, 110 and the extension sidewall spacers 140 as a mask. The silicides 190 are formed using the gate stack 100, 110 and the contact sidewall spacers 150 as a mask. It is to be noted that the deep sources/drains 80 are generally formed using disposable deep source/drain sidewall spacers.

Immediately above and surrounding the transistors is a layer of dielectric insulation 160. The composition of dielectric insulation 160 may be any suitable material such as SiO$_2$ or organosilicate glass ("OSG"). The dielectric material 160 electrically insulates the metal contacts 170 that electrically connect the CMOS transistors 120, 130 shown in FIG. 1 to other active or passive devices (not shown) located throughout the semiconductor wafer 10. An optional dielectric liner (not shown) may be formed before the placement of the dielectric insulation layer 160. If used, the dielectric liner may be any suitable material such as silicon nitride.

In the example application, the contacts 170 are comprised of W; however, any suitable material (such as Cu, Ti, or Al) may be used. In addition, an optional liner material 180 such as Ti, TiN, or Ta (or any combination or layer stack thereof) may be used to reduce the contact resistance at the interface between the liner 180 and the silicided regions 190 of the gate polysilicon layer 110 and the source/drain extensions 90.

Subsequent fabrication will create the "back-end" portion (not shown) of the semiconductor wafer 10. The back-end generally contains one or more interconnect layers (and possibly via layers) that properly route electrical signals and power though out the completed integrated circuits.

The basic processing steps of the present invention which are employed in forming the silicide contact region which enables the formation of a NMOS, PMOS or CMOS device having low silicide interface resistance are now described. Process steps other than the SD and XSD implants, the SD activation, and the silicide process, are generally not described herein in any detail, to avoid obscuring the present invention.

Figure 2:
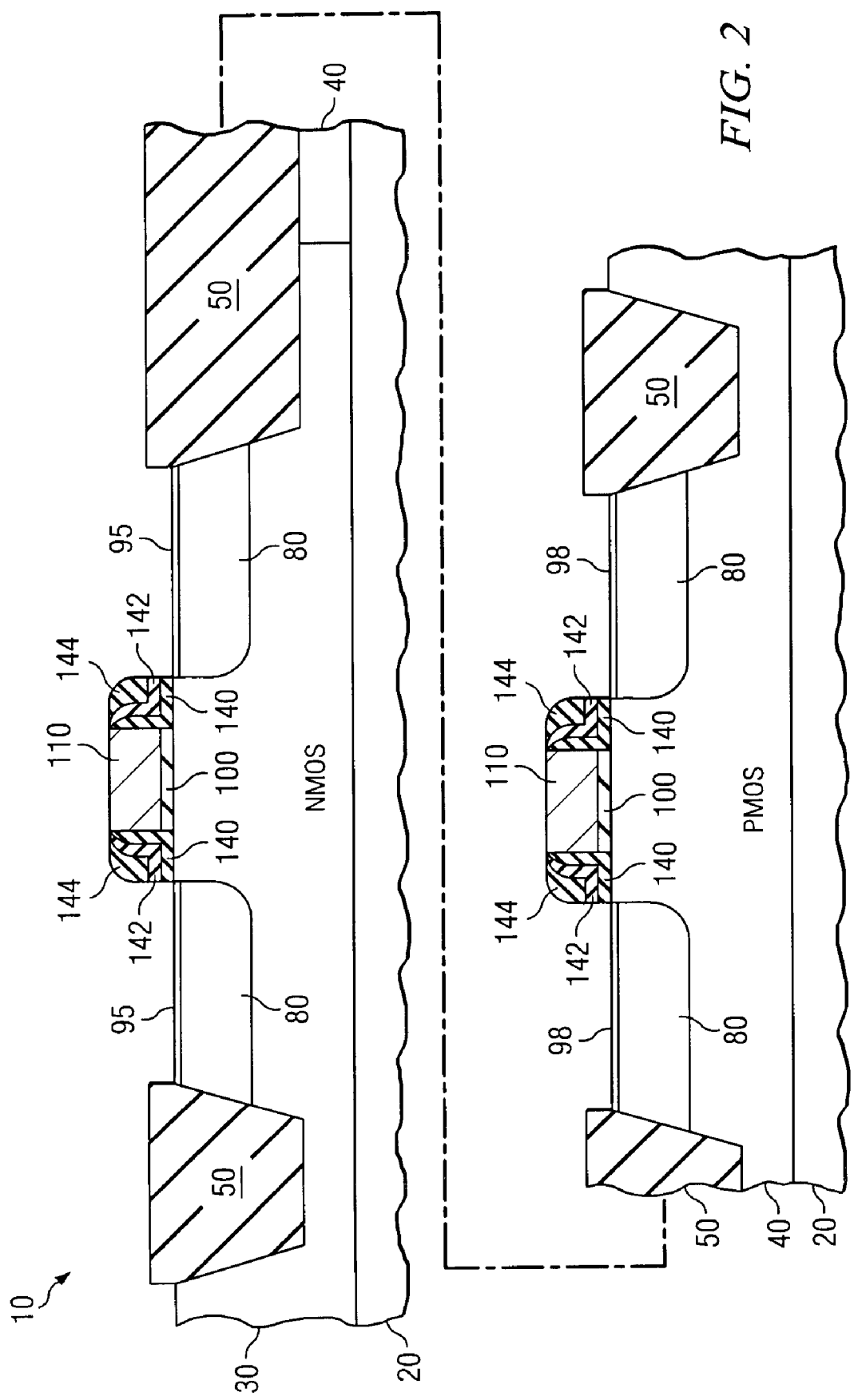
FIG. 2 is a cross-sectional diagram of an intermediate process step wherein ultra-shallow extra S/D (XSD) implanted regions are formed for both PMOS and NMOS in an exemplary CMOS process for forming shallow junction transistors having low silicide interface resistance in accordance with an embodiment the present invention.

FIG. 2 shows a cross sectional view of a CMOS wafer following deep S/D implant, shown as 80 and dopant primarily from the XSD implants according to the present invention shown as surface region 95 for NMOS and surface region 98 for PMOS. The source/drain extension sidewall spacer layer 140 is on the outer surface of the gate stack 100, 110. The source/drain extension sidewall spacer layer 140 is comprised of oxide, or any suitable material, such as an oxynitride, silicon dioxide, nitride, or any other dielectric material or layers of dielectric materials. Disposable deep source/drain sidewall spacers 142, 144 are proximate to the extension sidewall spacer layer 140. These sidewall spacers are considered disposable because they will not be left on the final semiconductor wafer 10. The deep source/drain sidewall spacers 142, 144 may be formed using any standard deposition and etch process. In one embodiment, the deep source/drain sidewall spacers are comprised of an oxide layer 142 and a silicon nitride layer 144 that are formed with a CVD process and subsequently anisotropically etched.

The disposable deep source/drain sidewall spacers 142, 144 (as well as the gate electrode (e.g. polysilicon) layer 110) may be used as a template for the implantation of dopants into the locations for the deep sources and drains and XSD implants according to the present invention, together with photoresist or other masking material defined by masking levels to mask the other transistor type (except openings in the other transistor type for well and/or substrate contacts).

As used herein, implantation refers to broad injection processes, including ion implantation as well as plasma implantation, plasma implantation including pulsed plasma doping and plasma immersion ion implantation. The implantation of dopants into the locations for the deep sources and drains 80 shown in FIG. 2, may be accomplished through any one of a variety of processes, such as deep ion implantation or even deep diffusion from a surface dopant source. The dopants used to create the deep sources and drains 80 for PMOS transistors are typically boron and for NMOS transistors are typically arsenic; however, other dopants or combinations of dopants may be used.

The implantation of the dopants is self-aligned with respect to the outer edges of the deep source/drain sidewall spacers 142, 144. Using the same mask, both the conventional deep n+ and n+ XSD implant according to the invention can be performed. Similarly, both the conventional deep p+ and p+ XSD implant according to the invention can be performed using the same mask. Although the same dopant species (e.g. As for n+) may be used for both the deep n+ SD and n+ XSD implants, there is no requirement that the same dopant species be used. For example, the deep SD can utilize P, while the XSD according to the present invention can utilize As.

The present Inventors have found that maximizing the dopant surface concentration of the source and drain is not necessarily optimal, since the silicide formation process can consume a significant portion of the Si at the surface, such as about 200 A. The energy of the XSD implant(s) are generally selected to provide an as implanted peak from 150 A to 500 A measured from the surface. For an As implant, the implant energy selected is generally in a range from about 1 to 3 KeV, such as 2 KeV. In one embodiment, the peak in the as-implanted dopant concentration is placed at about 200 to 300 A, such as 250 A.

A design issue regarding the XSD implant parameters is that the additional dose (above the conventional SD dose) should not result in degraded short channel effects (SCE), since when the deep SD and XSD are performed using the same masking level, the XSD dose generally sees the high temperature deep SD anneal (>950 C), such as a RTA spike anneal which is generally performed at a temperature>1000 C as described below. The XSD dose is at least $5 \times 10^{14}$ cm$^{-2}$, and is generally at least $1 \times 10^{15}$ cm$^{-2}$.

In an embodiment of the invention, the XSD implant is essentially frozen implant in place. A heavy/slow diffusing dopant (e.g. As) does not generally require a co-implant to be essentially frozen. However, light, relatively fast diffusing dopants, such as boron and phosphorous can be preceded by non-dopant ion bombardment to provide amorphization to essential eliminate transient enhanced diffusion (TED), such as Si, Ge or carbon co-implants, such as $1 \times 10^{15}$ cm$^{-2}$ at around 5 KeV for carbon, to achieve a suitable level of amorphization to provide the desired essentially frozen behavior.

For the NMOS device, Arsenic is generally a good n-type dopant for the XSD, because Arsenic (As) in silicon diffuses much less as compared to phosphorus. As described below, in the case of As, limiting the dose to $2 \times 10^{15}$ cm$^{-2}$ provides more than an order of magnitude decrease in interface resistance, with only a 15 mV increase in DIBL as compared to device performance without the XSD in the same masking level embodiment. Using a DIBL level of 200 mV as a cutoff, the As dose in this embodiment can be as high as about $2.8 \times 10^{15}$ cm$^{-2}$. Relaxing DIBL to 240 mV allows an As dose of $4 \times 10^{15}$ cm$^{-2}$. However, as noted below, by adding an extra masking level, the XSD implant can occur after the high temperature anneal and thus be at higher dosages than described above. Phosphorous with doses similar to those disclosed above for the Arsenic XSD can generally be used when accompanied by a suitable co-implant that limits Phosphorous diffusion.

For the PMOS device, a suitable Boron XSD dose is at least $8 \times 10^{14}$ cm$^{-2}$, and is generally at least $1 \times 10^{15}$ cm$^{-2}$. Useful dosages extend to as high as about $3 \times 10^{15}$ cm$^{-2}$, and can be even higher for a relaxed DIBL limit (e.g. 240 mV). As noted above, as with Phosphorous, the Boron XSD should generally be co-implanted to limit diffusion.

It is to be noted that due to lateral straggling of the implanted species, the deep sources/drains 80 and XSD 95 and 98 may initiate slightly inside the outer corner of the deep source/drain sidewall spacers 144. Following SD and XSD implant for the NMOS, an amorphous region in 80 and 95 generally forms. However, in the case of boron implant for PMOS, an amorphous region is generally not obtained. In the case of boron, and in some cases P, a non-dopant specie, such as C, Si or Ge may be co-implanted at a sufficient concentration at the interface region to provide PA before XSD implantation. As implanted, for both the NMOS and PMOS the active dopant concentration is essentially zero in both the deep SD regions 80 as well as the XSD regions 95 and 98.

Now the disposable deep source/drain sidewall spacers 142, 144 are removed. In the exemplary process, the source/drain regions 80 and XSD region 95 and 98 are activated by a source/drain anneal step. However, this anneal step may be performed at any stage in the manufacturing process, such as before the removal of the deep source/drain sidewall spacers 142, 144. This anneal step acts to repair the damage to the semiconductor wafer and to activate the dopants in the deep sources/drains 80 and XSD region 95 and 98. The activation anneal may be performed by any technique such as Rapid Thermal Anneal ("RTA"), flash lamp annealing ("FLA"), or laser annealing. In the example application, the RTA is performed as a flash anneal at a temperature of approximately 1000 to 1060 C. This anneal step often causes some lateral and vertical migration of dopants in the deep sources and drains 80 and XSD 95 and 98.

The next step can be the formation of the source/drain extensions 90. The dopants within the source/drain extensions 90 are activated by an annealing process. This post extension implant anneal step can be performed with a continuous wave ("CW") laser annealing process. For example, a $CO_2$ laser annealer may be used for a short duration between 200 μs and 5 ms, or shorter, at a power density between 0.2 kW/mm$^2$ and 1 kW/mm$^2$ (but generally at 0.5 kW/mm$^2$). The laser radiation will cause the dopants to rapidly diffuse. Accordingly, the laser anneals are designed to be short enough to prevent significant diffusion. Although increased activation does generally result from the laser anneal including the XSD implanted dopant, this high activation occurs before deactivation due to silicide PA in the contact region, and the increased activation is thus lost due to PA. The resultant source/drain extensions 90 will have evenly distributed and highly activated dopants. However, other suitable processes for this annealing step. For example, a pulsed laser anneal, a flash anneal, or an arc lamp anneal may be used. An optional additional anneal may be performed to reduce the crystal damage within the semiconductor wafer 10. This additional anneal may be performed using any suitable process, such as a flash RTA.

The next step in the example manufacturing process is the silicide loop. The purpose of the silicide loop is the creation of silicide layer 190 (see FIG. 1). However, the semiconductor wafer 10 may be prepared for the silicide loop by forming contact sidewall spacers 150 shown in FIG. 1, which will be used to facilitate the proper placement of the silicide 190. The first step in the formation of the contact sidewall spacers 150 can be the deposition of the oxide layer 152. The oxide layer 152 may be deposited by any suitable process such as CVD. Next, the nitride layer 154 is deposited over the oxide layer 152. The nitride layer 154 may also be deposited by any suitable process such as CVD. It is within the scope of the invention to use more layers (i.e. a spacer oxide layer, a silicon nitride layer, and a final oxide layer) or less layers (i.e. just an oxide layer or a nitride layer) to create the contact sidewall spacers.

The contact sidewall spacer layers 152, 154 are now etched to create the contact sidewall spacers 150. In the example application, the contact sidewall nitride layer 154 is etched with a standard anisotropic dry etch. Then the contact sidewall oxide layer 152 is etched with a standard wet or dry etch. The formation of the contact sidewall spacers 150 is now complete and the semiconductor wafer 10 is subjected to a standard post-etch cleaning process. The active silicon surfaces of the semiconductor wafer 10 are now exposed and ready for further processing.

Prior to metal deposition to form the silicide, a PA step is generally performed. The PA step is well known to reduce the density of pipes in the silicon proximate to the silicide contact region. The PA step generally comprises the implantation of low energy/high dose Si or Ge, such as a 5 keV 1×10$^{15}$ Silicon implant. Following the PA step, although the active dopant concentration in the deep SD 80 generally remains high (e.g. 30 to 50%), the active surface concentration (within about 300 A of the surface, thus being in regions 95 and 98) is essentially zero.

The next step of the silicide loop is generally the deposition of a metal (typically a transition metal) comprising interface layer over the top surface of the semiconductor wafer 10. The interface layer is generally comprised of Ni; however, other suitable materials such as Co may be used. An optional capping layer (not shown) may also be formed over the interface layer. If used, the capping layer acts as a passivation layer that prevents the diffusion of oxygen from ambient into the interface layer. The capping layer may be any suitable material, such as TiN.

The next step of the silicide loop is an anneal, which is referred to herein as a the silicide anneal which is typically performed at 450 C for 10 minutes. This anneal process will cause a silicide 190 (i.e. a Ni-rich silicide or Ni mono-silicide) to form over all active surfaces that are in contact with the interface layer; namely, at the surface of the source/drain extensions 90, the surface of the well regions 30, 40, and the surface of the gate electrodes 110. In addition, this silicide anneal also activates a portion of the XSD implant according to the present invention in regions 95 and 98, for example about 5 to 12% of the chemical concentration, such as 10%. Following the silicide anneal, although only a small fraction of the implanted dose is activated, the available active dopant concentration is very high near the silicide interface.

The next step in the silicide loop is the removal of the interface layer. The interface layer (and the capping layer, if used) are removed using any suitable process such as a wet etch process (i.e. using a fluid mixture of sulfuric acid, hydrogen peroxide, and water). An optional second silicide anneal can be performed to further react the silicide 190 with the exposed surfaces of well regions 30, 40, the gate electrode 110, and the extension sources and drains 90. If the initial silicide anneal process of the silicide loop did not complete the silicidation process, this second anneal will ensure the formation of a mono-silicide NiSi—which lowers the sheet resistance of the silicide 190. As with the first silicide anneal, the second silicide anneal is performed at a low temperature, such as at 450 C.

The fabrication of the semiconductor wafer 10 now continues using standard manufacturing processes. Generally, the next step is the formation of the dielectric layer. Referring to FIG. 1, the dielectric insulator layer 160 may be formed using plasma-enhanced chemical vapor deposition ("PECVD") or another suitable process. The dielectric insulator 160 may be comprised of any suitable material such as $SiO_2$ or OSG.

The contacts 170 are formed by etching the dielectric insulator layer 160 to expose the desired gate, source and/or drain location. An example etch process for creating the contact holes is an anisotropic etch. The etched holes are usually filled with a liner 180 before forming the contacts 170 in order to improve the electrical interface between the silicide 190 and the contact 170. Then the contacts 170 are formed within the liner 180; creating the initial portion of the electrical interconnections from the transistors 120, 130 to various semiconductor components (not shown) located within the semiconductor substrate 10.

The fabrication of the final integrated circuit now continues with the fabrication of the back-end structure (not shown). As discussed above, the back-end structure contains the metal interconnect layers of the integrated circuit. Once the fabrication process is complete, the integrated circuit will be tested and packaged.

Figure 3:
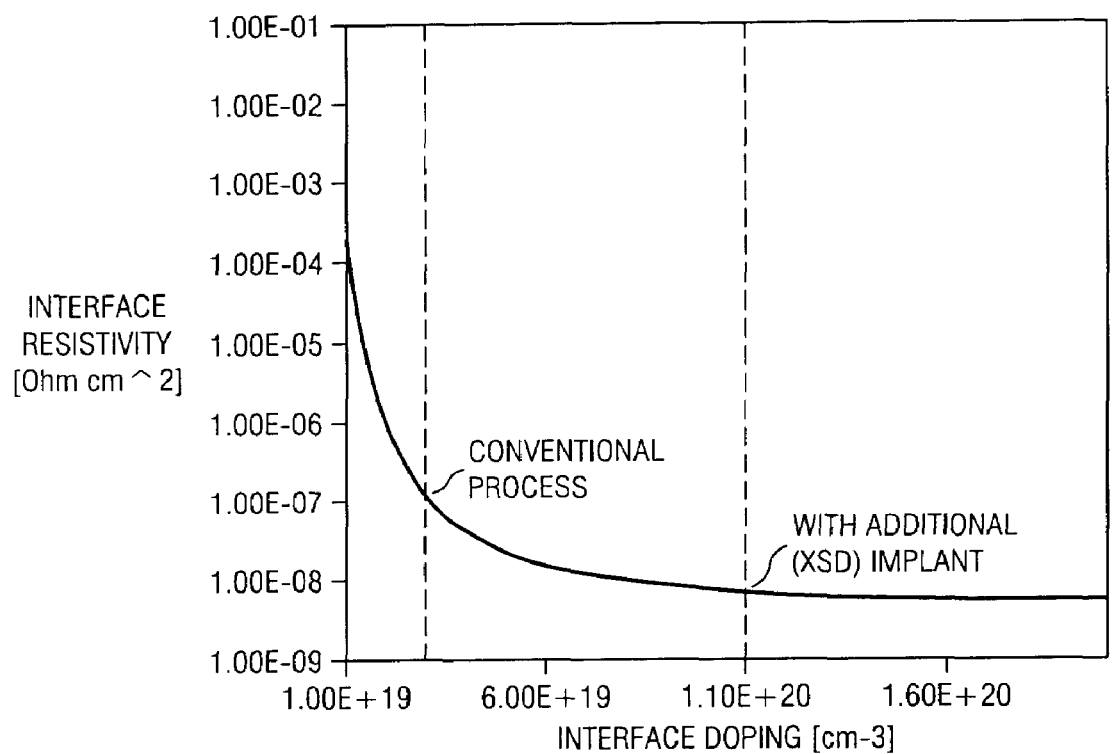
FIG. 3 provides simulation results showing 25 C silicide interface resistivity as a function of active n-type interface doping, according to an embodiment of the invention. In a conventional process, the active interface doping is about $2\times10^{19}$ providing an interface resistivity of $1\times10^{-7}$ Ohm·cm$^2$. An exemplary process according to the present invention including an XSD implant which raises the active concentration to around $1\times10^{20}$ lowers the silicide interface resistivity compared to the conventional process by more than an order of magnitude to $<1\times10^{-8}$ Ohm·cm$^2$.

FIG. 3 provides simulation results showing 25 C silicide interface resistivity as a function of active n-type interface doping. As shown, in a conventional process, the active interface doping is about 2×10$^{19}$ cm$^{-3}$ providing an interface resistivity of 1×10$^{-7}$ Ohm·cm$^2$. An exemplary process according to the present invention adds an ultra-shallow extra SD (XSD implant of As 2×10$^{15}$ cm$^{-2}$ at 2 KeV)). This implant (and the deep SD portion therein) activated by a silicide anneal at 450 C raises the active concentration to around 1×10$^{20}$ (chemical concentration is >1×10$^{21}$ cm$^{-3}$) near the Si surface which lowers the silicide interface resistivity compared to the conventional process by more than an order of magnitude to <1×10$^{-8}$ Ohm·cm$^2$.

Figure 4A:
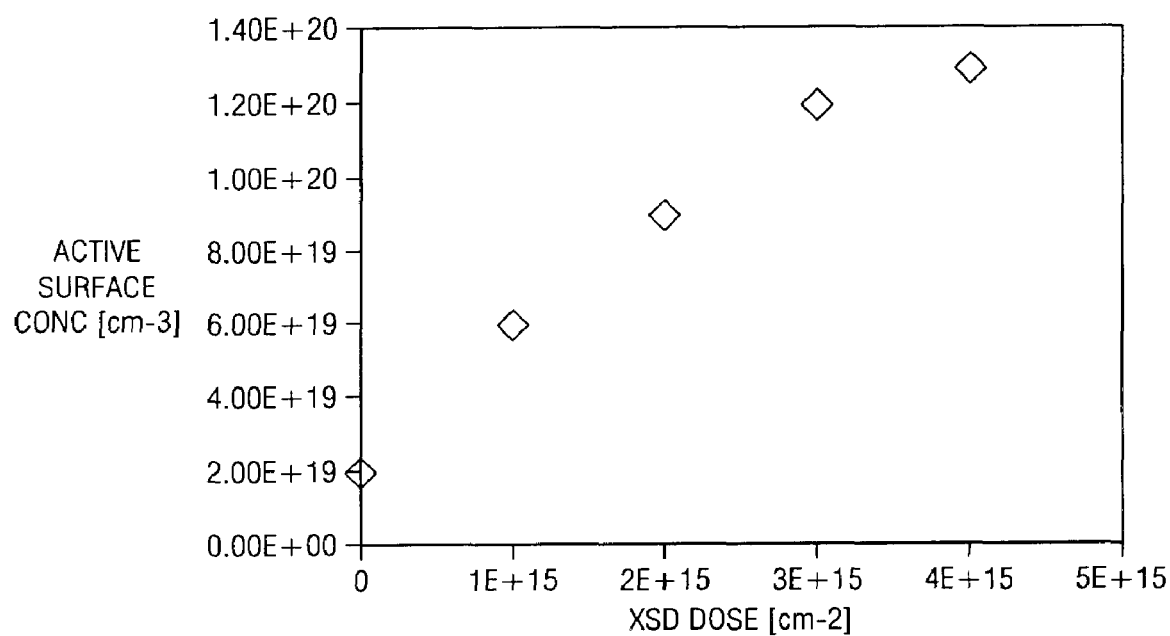
FIGS. 4(a)-(c) provides 25 C simulation results showing active n-type surface concentration as a function of XSD dose, drain induced barrier lowering (DIBL) as a function of XSD dose, and silicide interface resistance as a function of XSD dose, respectively, in accordance with an embodiment the present invention.
Figure 4B:
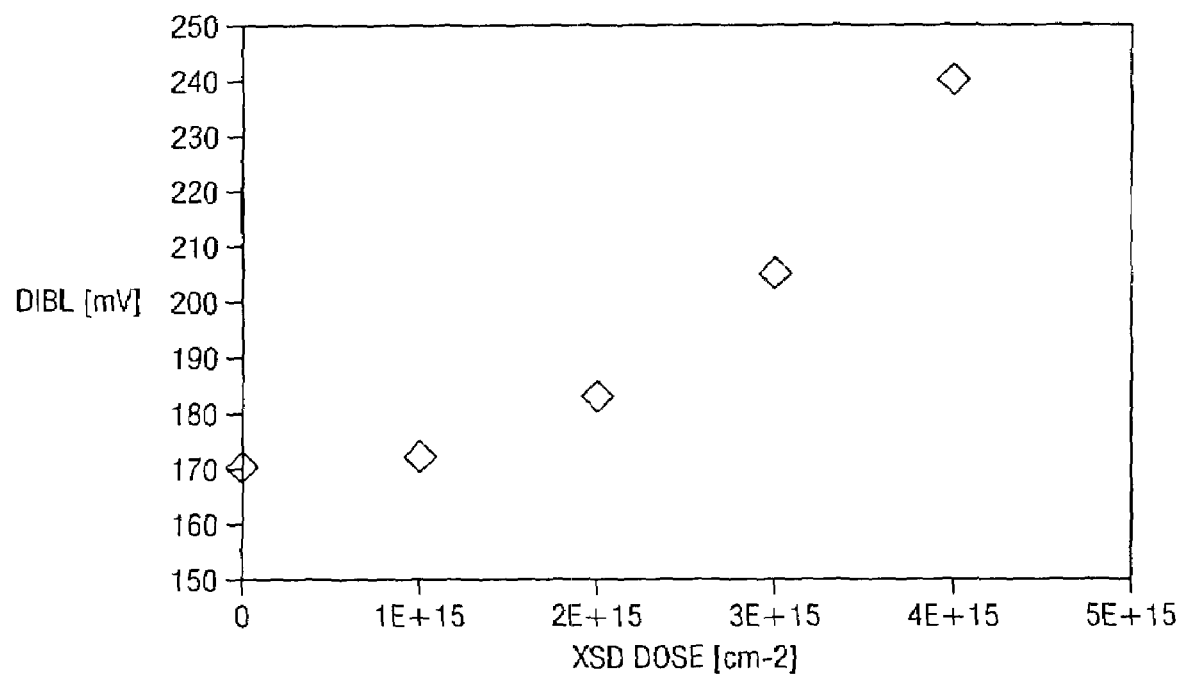
Figure 4C:
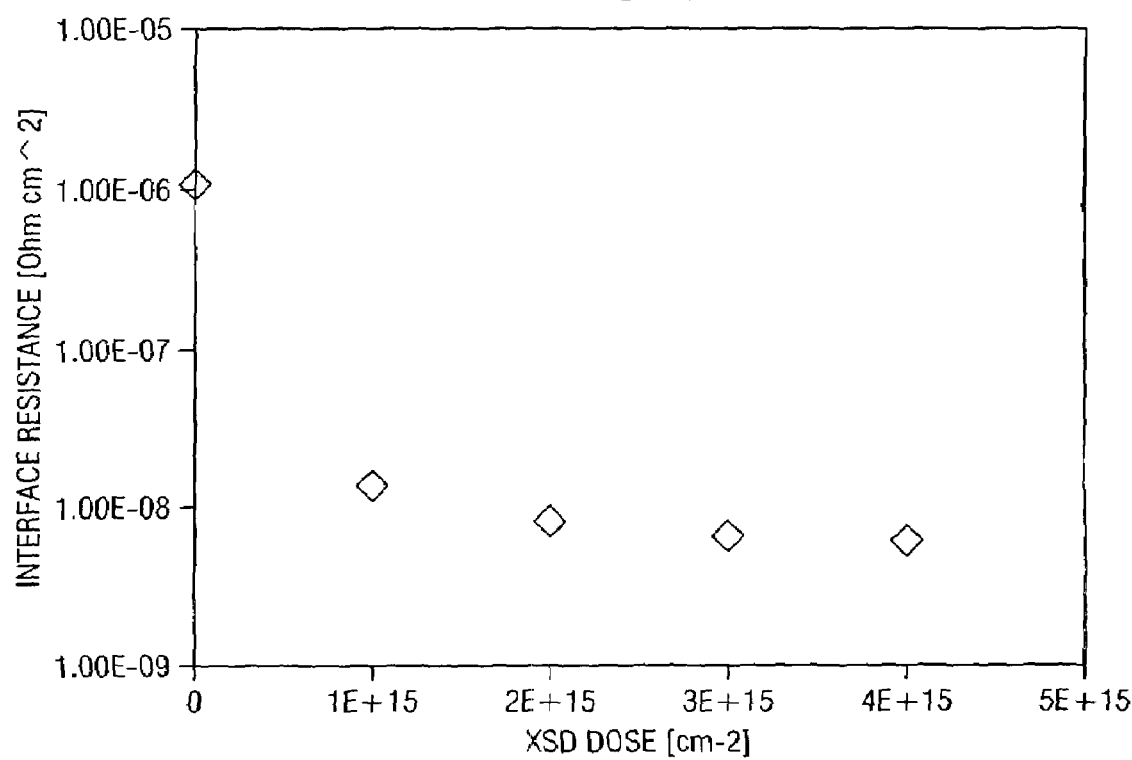

FIGS. 4(a)-(c) provide 25 C simulation results showing active n-type surface concentration as a function of an XSD comprising an As 2 keV dose, drain induced barrier lowering (DIBL) as a function of XSD dose, and silicide interface resistance as a function of XSD dose, respectively. The activation process used for the simulation was a silicide anneal, comprising 450 C for 10 minutes. In FIG. 4(a), the active surface concentration is seen to increase from $2 \times 10^{19}$ cm$^{-3}$ (SD implant alone; for no XSD implant) to about $1.3 \times 10^{20}$ cm$^{-3}$ (for a $4 \times 10^{15}$ cm$^{-2}$ xSD implant). Referring now for FIG. 4(b), as known in the art, DIBL is where the depletion from the source and drain ohmic contact doping in the channel results in the barrier between source and drain being reduced in short gate-length MOSFETs. An Arsenic dose at or below $2 \times 10^{15}$ cm$^{-2}$ shows a generally acceptably small impact on short channel behavior (DIBL<200 mV) was evidenced by the DIBL data shown. As shown in FIG. 4(c), an XSD comprising $1 \times 10^{15}$ cm$^{-2}$ dose of As at 2 keV reduces the silicide interface resistance to nearly $1 \times 10^{-8}$ Ohm·cm$^2$, while an XSD comprising $2 \times 10^{15}$ cm$^{-2}$ dose of As at 2 keV reduces the silicide interface resistance to nearly $9 \times 10^{-9}$ Ohm·cm$^2$. Assuming a design guideline of <200 in DIBL, an As dose around $2 \times 10^{15}$ cm$^{-2}$ is an appropriate design choice.

Various additional modifications to the invention as described above are within the scope of the claimed invention. As an example, the semiconductor wafer 10 may be subjected to a wafer cleaning process after any step in the manufacturing process to remove contamination from the wafer. In addition, an anneal process may be performed after any step in the above-described fabrication process. When used, the anneal process can improve the microstructure of materials and thereby improve the quality of the semiconductor structure.

Furthermore, although described as being implanted before the high temperature (e.g. >1000 C) flash anneal along with the S/D implants, one or both of the XSD implants according to the present invention can take place after the high temperature anneal, either before or after the silicide PA, because as noted above the SD surface activation is essentially lost by the silicide PA. Such alternative process sequences generally require extra masking steps, such as a mask exclusively for the XSD. However, in the process described above, the respective deep SD and XSD are implanted using the same masking level. The silicides 190 may be comprised of other materials such as titanium, tungsten, tantalum, or other conventional silicide materials or combinations of silicide materials. Similarly, instead of depositing SiGe, other suitable materials such as amorphous silicon ("α.Si") may be deposited in the recesses of the source/drain extensions 90 to form α.Si source/drain extensions 90.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents. In particular, as noted above, the present invention can also benefit a wide variety of non-MOS devices, whether active (e.g. bipolars, JFETs) or passives (e.g. inductors, capacitors).

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method of forming a MOS transistor, comprising the steps of:
   providing a semiconductor substrate;
   forming a gate insulator;
   forming a gate electrode over said gate insulator;
   forming a source and drain by performing a first S/D implant of a first dopant type, said source and drain separated by a channel region of a second dopant type having said gate electrode and said gate insulator thereon, and
   implanting a second S/D implant of said first dopant into a surface portion of said source and said drain;
   annealing said first and second S/D implants;
   depositing a metal comprising interface layer on an interface region at a surface portion of said source and said drain;
   performing a silicide anneal to form a silicide layer and to activate said first dopant provided by said first and second S/D implants, wherein at said interface region a total chemical dopant concentration of said first dopant is at least $5 \times 10^{20}$ cm$^{-3}$.

2. The method of claim 1, wherein said implanting step comprises a dose for said second S/D implant of between $5 \times 10^{14}$ cm$^{-2}$ and $4.0 \times 10^{15}$ cm$^{-2}$.

3. The method of claim 1, wherein said implanting step comprises implanting As, at an energy of 1.0 to 3.0 KeV and a dose between $5 \times 10^{14}$ cm$^{-2}$ and $2.0 \times 10^{15}$ cm$^{-2}$.

4. The method of claim 3, wherein said energy is between 1.5 to 2.5 KeV.

5. The method of claim 1, wherein said implanting step comprises implanting P, at dose between $5 \times 10^{14}$ cm$^{-2}$ and $2.0 \times 10^{15}$ cm$^{-2}$ and at an energy provide a projected range of between 150 A and 400 A in said surface portion.

6. The method of claim 1, wherein said implanting step comprises implanting B at dose between $8.0 \times 10^{14}$ cm$^{-2}$ and $3.0 \times 10^{15}$ cm$^{-2}$ and at an energy provide a projected range of between 150 A and 400 A in said surface portion.

7. The method of claim 1, wherein said silicide anneal is performed at a temperature ≦500 C.

8. The method of claim 1, further comprising the step of pre-amorphization Before said second S/D implant using a non-dopant species.

9. The method of claim 1, wherein a ratio of active concentration of said first dopant to said chemical concentration of said first dopant is <15%.

10. The method of claim 1, wherein said step of forming said silicide layer comprises the step of pre-amorphization.

11. The method of claim 1, wherein said first and second S/D implant are performed using the same mask level.

12. The method of claim 1, wherein said first and second implant are performed using a different masking level.

13. A method of forming a NMOS transistor, comprising the steps of:
   providing a semiconductor substrate;
   forming a gate electrode over a gate insulator;
   forming a source and drain by performing a first n+S/D implant, said source and drain separated by a p-type channel region having said gate electrode and said gate insulator thereon, and implanting a second n+S/D implant into a surface portion of said source and said drain, wherein said second n+S/D implant comprises an As dose of $5\times10^{14}$ to $2.2\times10^{15}$ cm$^{-2}$ at an energy of 1.5 to 2.5 KeV;

annealing said first and second n+S/D implants;

pre-amorphizing an interface region at a surface portion of said source and said drain;

depositing a metal comprising interface layer on said interface region;

performing a silicide anneal at a temperature of <500 C to form a silicide layer and partially activate dopant provided by said first and second n+S/D implants, wherein at said interface region a total chemical dopant concentration of n-type dopant is at least $5\times10^{20}$ cm$^3$.

* * * * *